(12) United States Patent
Muthiah et al.

(10) Patent No.: US 10,769,332 B2
(45) Date of Patent: Sep. 8, 2020

(54) AUTOMATIC SIMULATION FAILURES ANALYSIS FLOW FOR FUNCTIONAL VERIFICATION

(71) Applicant: HCL Technologies Limited, Noida (IN)

(72) Inventors: Manickam Muthiah, Chennai (IN); Sathish Kumar Krishnamoorthy, Chennai (IN)

(73) Assignee: HCL Technologies Limited, Noida, Uttar Pradesh (*) Notice: Subject to any disclaimer, the term of this patent is extended or adjusted under 35 U.S.C. 154(b) by 5 days.

(21) Appl. No.: 16/125,841

(22) Filed: Sep. 10, 2018

(65) Prior Publication Data
US 2019/0325090 A1 Oct. 24, 2019

(30) Foreign Application Priority Data

Apr. 18, 2018 (IN) .............................. 201811014688

(51) Int. Cl.
G06F 30/3323 (2020.01)
G06F 30/30 (2020.01)
(52) U.S. Cl.
CPC .......... G06F 30/3323 (2020.01); G06F 30/30 (2020.01)

(58) Field of Classification Search
USPC ........................................................ 716/136
See application file for complete search history.

(56) References Cited

U.S. PATENT DOCUMENTS

2006/0161508 A1* 7/2006 Duffie ................... G06F 11/263
706/55

* cited by examiner

Primary Examiner — Eric D Lee
(74) Attorney, Agent, or Firm — HM Law Group LLP; Vanintheran Moodley

(57) ABSTRACT

Disclosed is a system and method for automatically diagnosing an error by performing failure analysis of functional simulation pertaining to a Design Under Verification (DUV) or System Under Verification (SUV). A prediction unit generates a set of expected output packets upon processing a set of input packets' copy. A comparison unit compares an actual output packet, from the set of actual output packets, with an expected output packet, from the set of expected output packets, corresponding to the actual output packet. When there is a mismatch, the actual output packet is compared with at least one subsequent expected output packet until the match is found. The diagnosing unit automatically diagnoses at least one of a packet drop error, an ordering error, an error in routing, by performing a systematic failure analysis and reports a diagnostic information and/or default diagnostic information associated with the error.

14 Claims, 6 Drawing Sheets

AUTOMATIC SIMULATION FAILURES ANALYSIS FLOW FOR FUNCTIONAL VERIFICATION

CROSS-REFERENCE TO RELATED APPLICATIONS AND PRIORITY

The present application claims benefit from Indian Complete Patent Application No. 201811014688 filed on 18 Apr. 2018 the entirely of which is hereby incorporated by reference.

TECHNICAL FIELD

The present disclosure in general relates to a field of hardware logic/electronic design/digital circuits verification. More particularly, the present invention relates to an automatic diagnosis of an error by performing a systematic failure analysis of a functional simulation pertaining to a Design Under Verification (DUV) or System Under Verification (SUV) and reporting at least one of a diagnostic information and a default diagnostic information associated with the error.

BACKGROUND

Integrated Circuit Design (ICD) or Chip Design is a branch of electronics engineering. The ICD deals with encompassing the particular logic and circuit design techniques required for designing Integrated Circuits (ICs). Initially, the ICs contained only a few transistors. However, the number of transistors in the ICs has increased dramatically since then. The term "Large Scale Integration" (LSI) was first used to describe this theoretical concept, which further gave rise to the terms including, but not limited to, a "Small-Scale Integration" (SSI), a "Medium-Scale Integration" (MSI), a "Very-Large-Scale Integration" (VLSI), and an "Ultra-Large-Scale Integration" (ULSI). The development of the VLSI started with hundreds of thousands of transistors in the early 1980s, and has continued beyond ten billion transistors as of now.

Modern ICs are immensely complicated. The complexity of the modern IC design and market pressure for producing designs rapidly has led to the extensive use of automated design tools in process of IC designing. In short, the design of an IC using an Electronic Design Automation (EDA) is the process of design, verification and testing of the instructions that the IC has to carry out.

The EDA and an Electronic Computer-Aided Design (ECAD) is a category of tools that is used to design electronic systems such as integrated circuits as well as printed circuit boards. Designers use these tools that work together in a flow to design and analyze the entire semiconductor chips. The EDA tools are essential for designing modern semiconductor chips which have billions of components. The EDA tools help chip design with programming languages that compiled them to silicon. Due to immediate result, there was a considerable increase in the complexity of the chips that could be designed, with improved access to design verification tools that are based on Logic Simulation. A chip designed using this process is easier to layout and more likely to function correctly, since the design of the chip could be simulated more thoroughly prior to construction. Although the languages and tools have evolved, this general approach of specifying the desired behaviour in a textual programming language and letting the tools derive the detailed physical design has remained the basis of digital IC design even today.

A Simulation (or "sim") is an attempt to model a real-life or hypothetical situation on a computer to study the working of the system. Predictions may be made about the behaviour of a system, by changing variables in the simulation. It is a tool to virtually investigate the behaviour of the system under study.

A logic simulation is the use of simulation software for predicting the behaviour of digital circuits and Hardware Description Languages (HDL). It simulates the logic before it is built. Simulations have the advantage of providing a familiar look and feel to the user in that it is constructed from the same language and symbols used in design. Simulation is a natural way for the designer to get feedback on their design, by allowing the user to interact directly with the design. Logic simulation may be used as a part of a Functional Verification process in designing hardware.

Functional verification is the process followed for verifying whether the logic design conforms to the design specification. In everyday terms, the functional verification asserts whether the proposed design do what is intended. This is a complex task, and takes the majority of time and effort in largest electronic system design projects.

The HDL, a specialized computer language, is used for describing the structure and behaviour of electronic circuits, and most commonly, digital logic circuits. The HDL enables a precise, formal description of an electronic circuit which allows for the automated analysis and simulation of an electronic circuit. The HDL is much like a programming language such as C Programming language. The HDL is a textual description language consisting of expressions, statements and control structures. One important difference between most programming languages and the HDLs is that the HDLs explicitly include the notion of time. The key advantage of the HDL, when used for systems design, is that the HDL allows the behaviour of the required system to be described (modelled) and verified (simulated) before synthesis tools translate the design into a real hardware (gates and wires). With time, VHSIC Hardware Description Language (VHDL) and Verilog emerged as the dominant HDLs in the electronics industry, while older and less capable HDLs gradually disappeared. Over the years, much effort has been invested in improving HDLs. The latest iteration of the Verilog, formally known as System Verilog, introduces many new features (classes, random variables, and properties/assertions) to address the growing need for better testbench randomization, design hierarchy, and reuse.

A testbench is an (often virtual) environment used to verify the correctness or soundness of a design or a model. In the context of firmware or hardware engineering, a testbench refers to an environment in which the design/system/product under development is verified with the aid of software and hardware tools. The suite of verification tools is designed specifically for the design/system/product under verification. The testbench, commonly referred as a verification environment (or just environment) contains a set of components including, but not limited to, bus functional models (BFMs), bus monitors, memory modules, and interconnect of such components with a Design Under Verification (DUV).

A simulation environment is typically composed of several types of components. A generator generates input vectors that are used to search for anomalies that exist between an intent (specifications) and implementation (HDL Code). Modern generators create directed-random and random stimuli that are statistically driven to verify random parts of the design. The randomness is important to achieve a high distribution over the huge space of the available input stimuli. To this end, users of these generators intentionally under-specify the requirements for the generated tests. It is the role of the generator to randomly fill this gap. This allows the generator to create inputs that reveal bugs not being searched by the user. The generators also bias the stimuli towards design corner cases to further stress the logic. Biasing and randomness serve different goals and there are trade-offs between them. As a result, different generators have a different mix of these characteristics. Since the input for the design must be valid (legal) and many targets (such as biasing) should be maintained, many generators use the Constraint Satisfaction Problem (CSP) technique to solve the complex verification requirements. The legality of the design inputs and the biasing arsenal are modelled. The model-based generators use this model to produce the correct stimuli for the target design.

Drivers translate the stimuli produced by the generator into the actual inputs for the design under verification. The generators create inputs at a high level of abstraction, as transactions and drivers convert this input into actual design inputs as defined in the specification of the design's interface.

A Monitor converts the state of the design and its outputs to a transaction abstraction level so it can be stored in a scoreboard's database to be checked later on.

A Scoreboard/Checker validates that the contents of the scoreboard are legal. There are cases where the generator creates expected results, in addition to the inputs. In these cases, the checker must validate that the actual results match the expected ones.

An Arbitration Manager is configured to manage all the above components together.

The simulator produces the outputs of the design, based on the design's current state (the state of the flip-flops) and the injected inputs. The simulator has a description of the design net-list. This description is created by synthesizing the HDL to a low gate level net-list.

Simulation based verification is widely used to "simulate" the design, since this method scales up very easily. Stimulus is targeted to exercise each line in the HDL code. The testbench is built to functionally verify the design by providing meaningful scenarios to check that given certain input, the design performs to the specification.

The level of effort required to debug and then verify whether the design is proportional to the maturity of the design. That is, early in the design's life, bugs and incorrect behaviour are usually found quickly. As the design matures, the simulation requires more time and resources to run, and errors will take progressively longer to be found.

One of the most critical tasks in developing a new hardware such as the IC chips, Field-Programmable Gate Arrays (FPGA), Application-Specific Integrated Circuits (ASIC), System On Chips (SOC) etc. is to verify them for different design/function/performance specifications. These specifications may be predefined by the customer of the chips or can be an industry standard too. Another challenge faced by the verification team of this hardware is to debug the failures (if any) that arise during the process of verification using the log file(s) and identify the root cause of each failure.

Current verification trend uses the method of simulating the DUV/SUV against constrained random tests within a configurable verification environment and then evaluating the DUV/SUV's outputs against their corresponding predictions. It is to be noted that there may be multiple possibilities including, but not limited to, packet drops, packet routed to an unintended interface, packet ordering issues, and a broken DUV functionality that may cause an error or failure during the simulation. Most of the time, the flaws or errors in the DUV/SUV's design and some functionality failures might be uncovered and get reported during data integrity checks as data mismatches. It is important to note that as per conventional system and methodologies the investigation and understanding of the errors/failures is performed manually by a verification engineer. Thus, for a complex system, manual investigation/debugging of the errors/failures is a cumbersome and a time consuming process.

SUMMARY

This summary is provided to introduce aspects related to systems and methods for automatically diagnosing an error by performing a systematic failure analysis of a functional simulation and reporting at least one of a diagnostic information and a default diagnostic information associated with the error. The aspects are further described below in the detailed description. This summary is not intended to identify essential features of the claimed subject matter nor is it intended for use in determining or limiting the scope of the claimed subject matter.

In one implementation, a system for automatically diagnosing an error by performing a systematic failure analysis of a functional simulation is illustrated. The system comprises a Design Under Verification or System Under Verification (DUV/SUV) and a testbench configured to communicate with the DUV/SUV. The DUV/SUV may be configured to process a set of input packets to generate a set of actual output packets. In one aspect, each input packet from the set of input packets may comprise a set of data fields. The testbench may comprise a prediction unit, a comparison unit, and a diagnosing unit. The prediction unit, corresponding to the DUV/SUV, may be configured to mimic data processing associated with the DUV/SUV. In one aspect, the prediction unit may be configured to process a set of input packets' copy for generating a set of expected output packets. The comparison unit may be configured to compare an actual output packet, from the set of actual output packets, with an expected output packet from the set of expected output packets. In one aspect, the expected output packet is corresponding to the actual output packet. In one implementation, an actual output packet may be compared with at least one subsequent expected output packet corresponding to the expected output packet. It is to be noted that the actual output packet may be compared with at least one subsequent expected output packet, when the actual output packet is not matched with the expected output packet. Further, the actual output packet may be compared with the at least one subsequent expected output packet until the match is found. Upon comparison, the diagnosing unit may be configured to diagnose at least one of a packet drop error, an ordering error, an error in routing and report at least one of a diagnostic information and a default diagnostic information associated with the error.

In another implementation, a method for automatically diagnosing an error by performing a systematic failure analysis of a functional simulation is disclosed. In order to diagnose the error, initially, a set of input packets may be processed by a Design Under Verification (DUV) or a System Under Verification (SUV) to generate a set of actual output packets. It is to be noted that each input packet from the set of input packets comprises a set of data fields. A prediction unit corresponding to the DUV/SUV may mimic data processing associated with the DUV/SUV. Further, the prediction unit may be configured to process a set of input packets' copy for generating a set of expected output packets. Upon mimicking the data processing, an actual output packet, from the set of actual output packets, may be compared with an expected output packet from the set of expected output packets. In one aspect, the expected output packet is corresponding to the actual output packet. In one embodiment, an actual output packet may be compared with at least one subsequent expected output packet corresponding to the expected output packet, when the actual output packet is not matched with the expected output packet. It is to be noted that the actual output packet may be compared with the at least one subsequent expected output packet until the match is found. Upon comparison, at least one of a packet drop error, an ordering error, an error in routing may be diagnosed and at least one of a diagnostic information and a default diagnostic information associated with the error may be reported.

In yet another implementation, non-transitory computer readable medium embodying a program executable in a computing device for automatically diagnosing an error by performing a systematic failure analysis of a functional simulation is disclosed. The program may comprise a program code for processing a set of input packets by a Design Under Verification (DUV) or a System Under Verification (SUV) to generate a set of actual output packets. It is to be noted that each input packet from the set of input packets may comprise a set of data fields. The program may further comprise a program code for mimicking data processing associated with the DUV/SUV to process a set of input packets' copy for generating a set of expected output packets. The program may further comprise a program code for comparing an actual output packet, from the set of actual output packets, with an expected output packet from the set of expected output packets. In one aspect, the expected output packet is corresponding to the actual output packet. In one implementation, the program may further comprise a program code for comparing an actual output packet with at least one subsequent expected output packet corresponding to the expected output packet, when the actual output packet is not matched with the expected output packet. It is to be noted that the actual output packet may be compared with the at least one subsequent expected output packet until the match is found. The program may further comprise a program code for diagnosing at least one of a packet drop error, an ordering error, an error in routing and reporting at least one of a diagnostic information and a default diagnostic information associated with the error.

BRIEF DESCRIPTION OF DRAWINGS

The foregoing detailed description of embodiments is better understood when read in conjunction with the appended drawings. For the purpose of illustrating the disclosure, example constructions of the disclosure are shown in the present document; however, the disclosure is not limited to the specific methods and systems disclosed in the document and the drawings.

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

Figure 1:
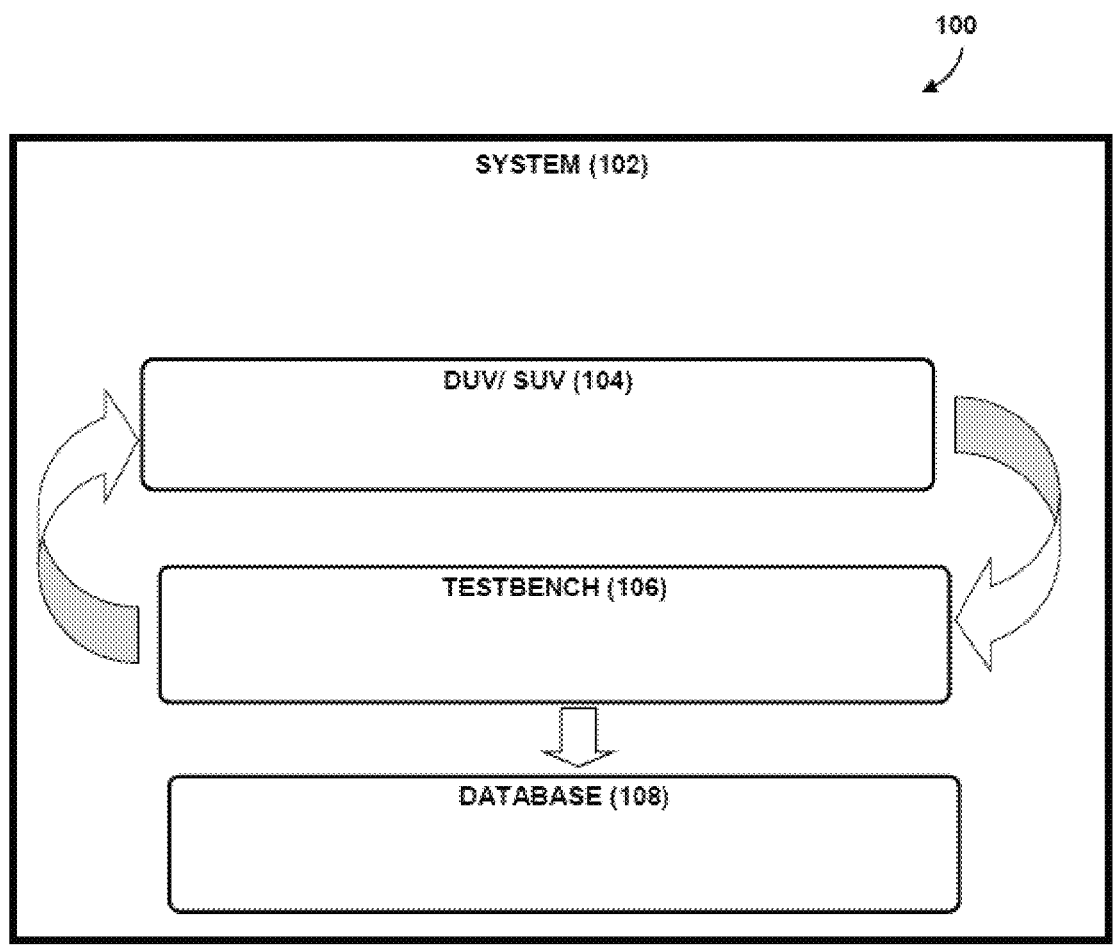
FIG. 1 illustrates an overview of a system configured to automatically diagnose an error by performing a systematic failure analysis of a functional simulation pertaining to a Design Under Verification (DUV) or System Under Verification (SUV), in accordance with an embodiment of the present subject matter.

The present system facilitates automatically diagnosing an error by performing a systematic failure analysis of a functional simulation of Design Under Verification (DUV) or System Under Verification (SUV) (may also be referred as Device Under Test (DUT) or System Under Test (SUT)). The DUV/SUV may correspond to a design of an electronic circuit or a design of an integrated chip written in a Hardware Description Language (HDL). The system comprises the DUV/SUV and a testbench configured to communicate with the DUV/SUV. The system aims to automate the diagnosing of the error by using a systematic approach of failure investigation flow and reporting of diagnostic information associated with the error diagnosed. Typical examples of the error include a packet drop error, an ordering error, a functionality failure/error of the DUV/SUV, and a packet routing error to a different output interface.

In order to diagnose the error, initially a set of input packets may be received at the DUV/SUV. Once the set of input packets are received, the DUV/SUV may process the set of input packets to generate a set of actual output packets. It is to be noted that each input packet of the set of input packets comprises a set of data fields. A set of expected output packets may be generated by the testbench. The set of expected output packets is corresponding to the set of actual output packets. Further, an actual output packet from the set of actual output packets may be compared with an expected output packet from the set of expected output packets. If the match is not found, subsequent expected output packets from the set of expected output packets may be compared with the actual output packet until the match is found. It is important to note that the comparison of the actual output packet and the expected output packet is facilitated by a data integrity checker. Once the match is found, at least one of a packet drop error, an ordering error, an error in routing may be diagnosed and at least one of a diagnostic information and a default diagnostic information associated with the error may be reported.

In one embodiment, when a functionality of the DUV/SUV fails, the actual output packet may not match with at least one packet from the set of expected output packets. Due of the failure in the functionality, plurality of data fields corresponding to the expected output packet may not match with the set of data fields from the actual output packet. Thus, in order to diagnose the error, a match score may be computed based on the comparison of the plurality of data fields in the expected output packet and the corresponding set of data fields in the actual output packet. Further, the error associated with the actual output packet may be diagnosed based on the match score and non-matching data fields.

In another embodiment, the DUV/SUV may consist of a set of output interfaces comprising at least one of an identical output interface and a non-identical output interface corresponding to a current output interface. It is to be noted that when no match is found, the actual output packet may be compared with a list of expected output packets corresponding to the at least one of the identical output interfaces. If the match is found, the error may be diagnosed as the error in routing of the actual output packet to the corresponding identical output interface.

In an alternative embodiment, when the actual output packet is not matched with the list of expected output packets, one or more non-identical output interfaces is identified. It is to be noted that data format corresponding to a set of expected output packets, at the non-identical output interface, may be different as compared to data format of the actual output packet. Thus, upon identifying the one or more non-identical output interfaces, an actual output packet's copy corresponding to the actual output packet may be generated. Upon generation, the actual output packet's copy may be transformed as per the data format corresponding to a set of expected output packets for the non-identical output interface. Subsequently, the transformed actual output packet's copy may be compared with the set of expected output packets for the respective non-identical output interface to diagnose the error. If the match is found, the error may be diagnosed as the error in routing to the non-identical output interface. In one aspect, when the transformed actual output packet's copy is not matched with the set of expected output packets, the actual output packet may be diagnosed as an unknown packet. In another aspect, when the one or more non-identical output interfaces is not identified, the actual output packet may be diagnosed as an unknown packet.

Referring now to FIG. 1, an overview of a system 102 for automatically diagnosing an error by performing a systematic failure analysis of a functional simulation pertaining to a Design Under Verification (DUV) or a System Under Verification (SUV) 104 is illustrated. The DUV/SUV 104 may be configured to process a set of input packets to generate a set of actual output packets. In one aspect, each input packet from the set of input packets may comprise a set of data fields. The system 102 includes a testbench 106 configured to communicate with the DUV/SUV 104. Further, the testbench 106 may be connected to a database 108.

In one embodiment, the testbench 106 may be configured to mimic data processing associated with the DUV/SUV. The testbench 106 may process a set of input packets' copy for generating a set of expected output packets. Further, the testbench 106 may compare an actual output packet, from the set of actual output packets, with an expected output packet, from the set of expected output packets. In one aspect, the expected output packet is corresponding to the actual output packet. In one implementation, the testbench 106 may compare an actual output packet with at least one subsequent expected output packet corresponding to the expected output packet, when the actual output packet is not matched with the expected output packet. Furthermore, the testbench 106 may compare the actual output packet with the at least one subsequent expected output packet until the match is found. Upon comparison, the testbench 106 may diagnose at least one of a packet drop error, an ordering error and report at least one of a diagnostic information and a default diagnostic information associated with the error.

Figure 2:
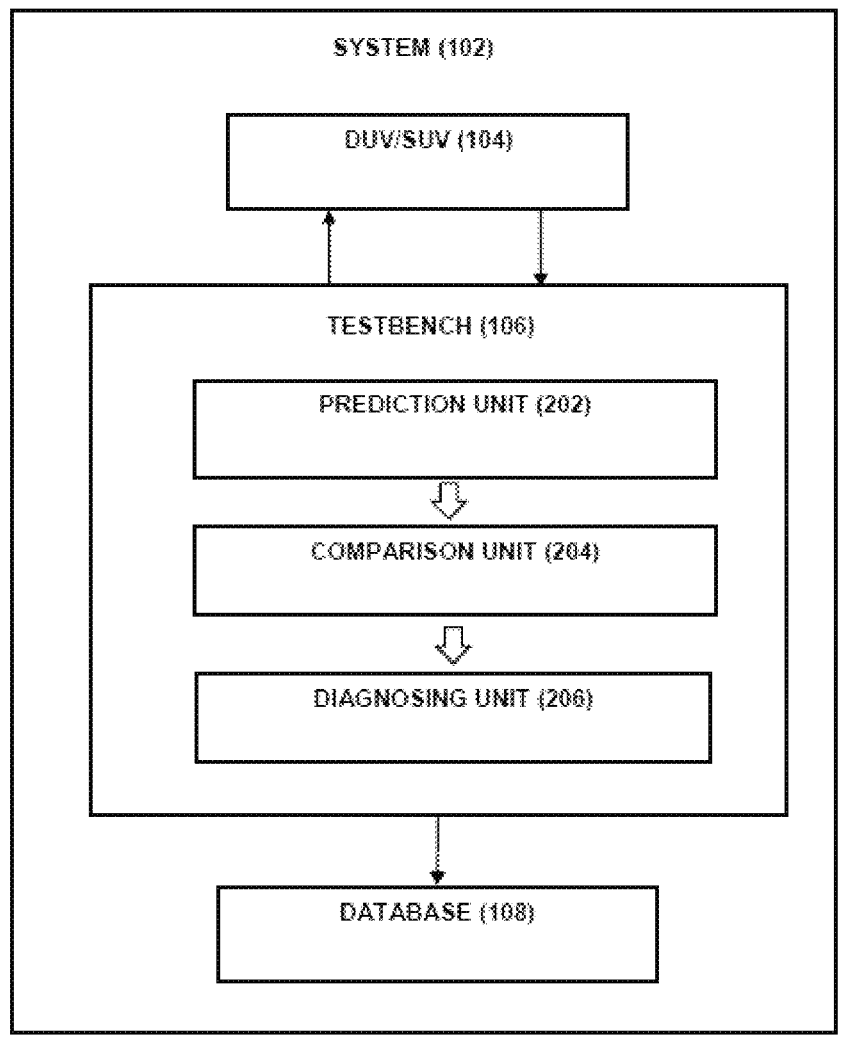
FIG. 2 illustrates the system, in accordance with an embodiment of the present subject matter.

Referring now to FIG. 2, the system 102 is illustrated in accordance with an embodiment of the present subject matter. In one embodiment, the system 102 comprises the DUV/SUV 104 connected to the testbench 106. The DUV/SUV 104 may be configured to process a set of input packets to generate a set of actual output packets. In one aspect, each input packet from the set of input packets may comprise a set of data fields. Further, the testbench 106 may be connected to the database 108. The testbench 106 may include a prediction unit 202, a comparison unit 204, and a diagnosing unit 206.

In one embodiment, the prediction unit 202, corresponding to the DUV/SUV, is configured to mimic data processing associated with the DUV/SUV. In one aspect, the prediction unit is configured to process a set of input packets' copy for generating a set of expected output packets. It is to be noted that each packet of the set of expected output packets comprises a plurality of data fields. Example of data fields include a channel id, a header, a session id, destination address, source address and others.

Figure 3A:
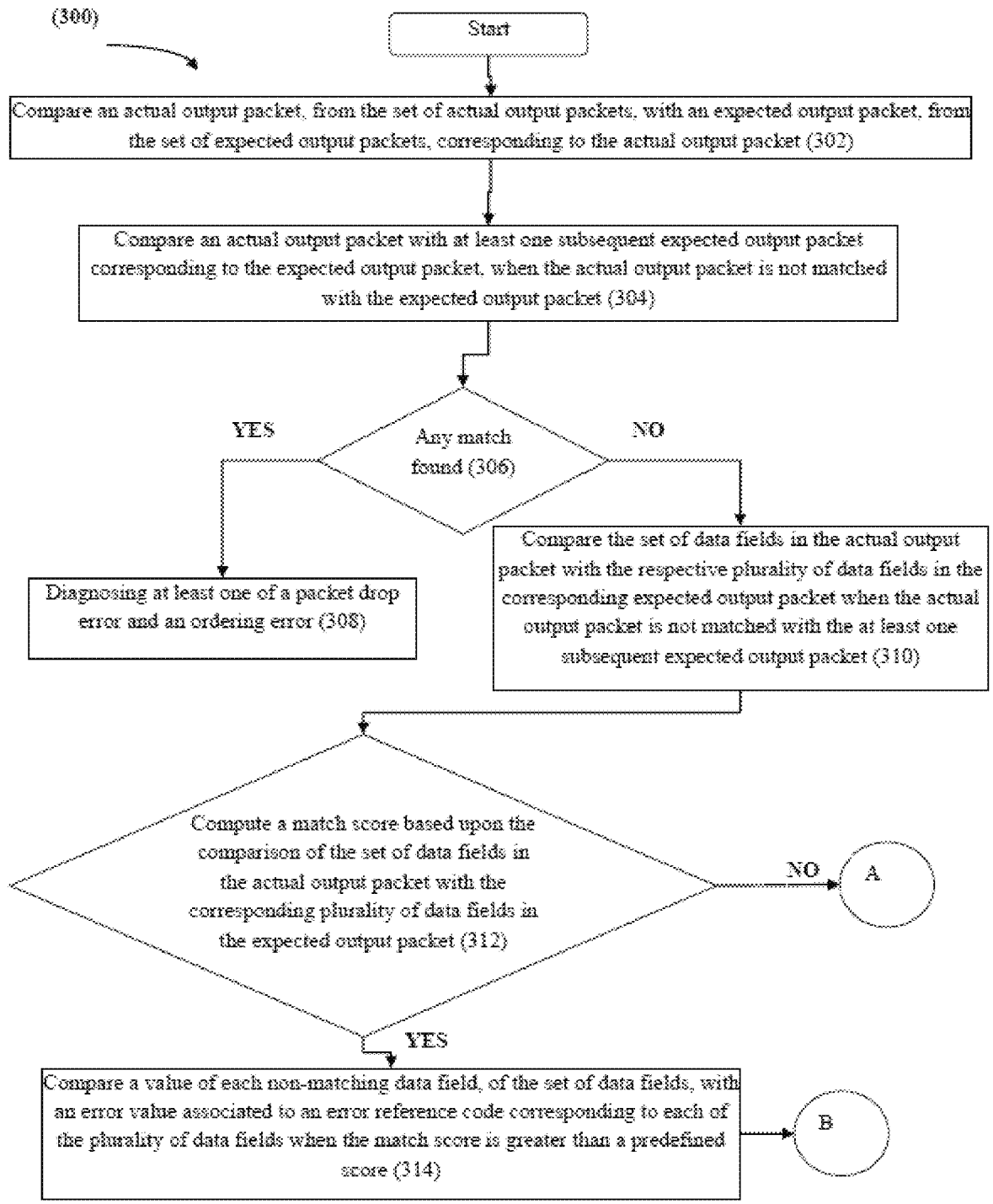
FIGS. 3a, 3b, and 3c illustrate a workflow of the system for automatically diagnosing an error by performing a systematic failure analysis of a functional simulation pertaining to the DUV/SUV, in accordance with an embodiment of the present subject matter.

Once the set of expected output packets are generated, at block 302 of FIG. 3a, the comparison unit 204 compares an actual output packet, from the set of actual output packets, with an expected output packet from the set of expected output packets. In one aspect, the expected output packet is corresponding to the actual output packet. If the actual output packet matches with the expected output packet, the comparison unit 204 may compare a subsequent actual output packet with a subsequent expected output packet. In one implementation, when the actual output packet is not matched with the expected output packet, at block 304 of the FIG. 3a, the comparison unit 204 compares the actual output packet with at least one subsequent expected output packet corresponding to the expected output packet. It is to be noted that the comparison unit 204 may continue to compare the actual output packet with the at least one subsequent expected output packet until a match is found.

As per block 306 of the FIG. 3a, if the match is found, the diagnosing unit 206, at block 308 of the FIG. 3a, diagnoses at least one of a packet drop error and an ordering error. In an alternate embodiment, if the match is not found, at block 310 of the FIG. 3a, the comparison unit 204 may compare the set of data fields present in the expected output packet with the corresponding plurality of data fields present in the actual output packet to identify a match between values of the data fields. It is to be noted that individual data fields corresponding to the actual output packet and the expected output packet are compared to identify a failure in functionality of the DUV/SUV. In one aspect, due to the failure in functionality, the individual data fields corresponding to the actual output packet and the expected output packet may not match. Typical examples of the failure in functionality include, but not limited to, skipping a packet/data field update, miscalculations in the data field values, using out of range values for the data fields, and corrupting the packet/data fields.

In order to diagnose the error, at block 312 of the FIG. 3a, a match score may be computed based on the comparison of the set of data fields in the expected output packet with the corresponding plurality of data fields in the actual output packet. In one implementation, the comparison unit 204 may compute the match score and compare the match score with a predefined score stored in the database 108. In general, the set of data fields are also predefined by an engineer or a tester. At block 314 of the FIG. 3a, when the match score is found greater than the predefined score, the comparison unit 204 may compare a value of each non-matching data field, of the set of data fields, with one or more error values for each of the plurality of data fields stored in an error reference code (hereinafter may interchangeably be referred as an error reference object). It is to be noted that the error reference code and the error values for each expected output packet are stored in the database 108.

Figure 3B:
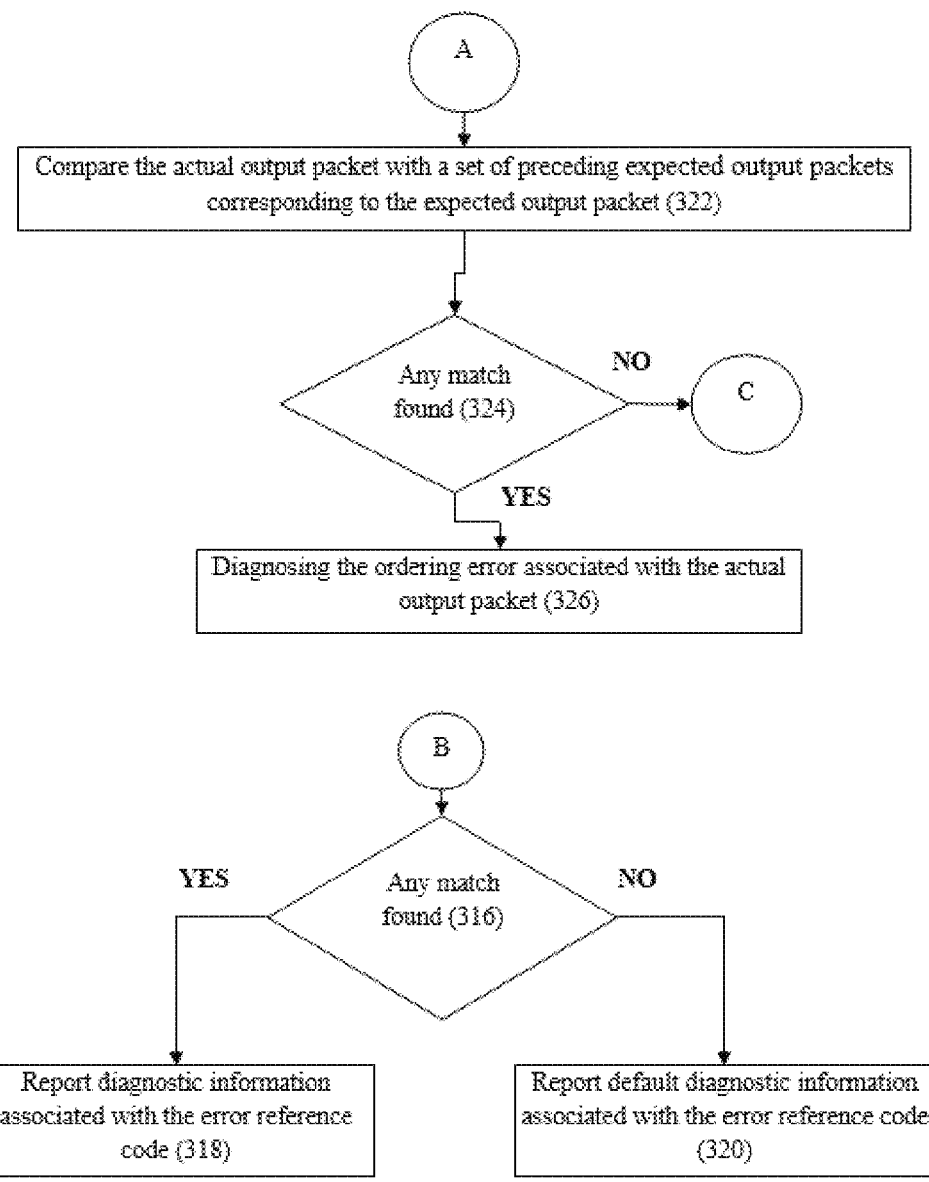

Once the value of at least one of a data field matches with the corresponding error value(s), at block 318 of the FIG. 3*b*, the diagnosing unit 206 may report the diagnostic information associated with the respective error value stored in the corresponding error reference object. If the value of the data field is not matched with the corresponding error value(s), at block 320 of the FIG. 3*b*, the diagnosing unit 206 may report default diagnostic information stored for the corresponding data field in the respective error reference object.

In another implementation, at block 322 of the FIG. 3*b*, the comparison unit 204 compares the actual output packet with a set of preceding expected output packets corresponding to the expected output packet. In one aspect, the comparison of the actual output packet with the set of preceding expected output packets corresponding to the expected output packet is performed after comparison of the actual output packet with at least one of the subsequent expected output packets. In other aspect, the comparison unit 204 may compare the actual output packet with the set of preceding expected output packets corresponding to the expected output packet before the comparison of the actual output packet with at least one of the subsequent expected output packets. Once the match is found, at block 326 of the FIG. 3*b*, the diagnosing unit 206 may diagnose the ordering error associated with the actual output packet. In other words, the actual output packet is reported late at the output of the DUV/SUV.

Figure 3C:
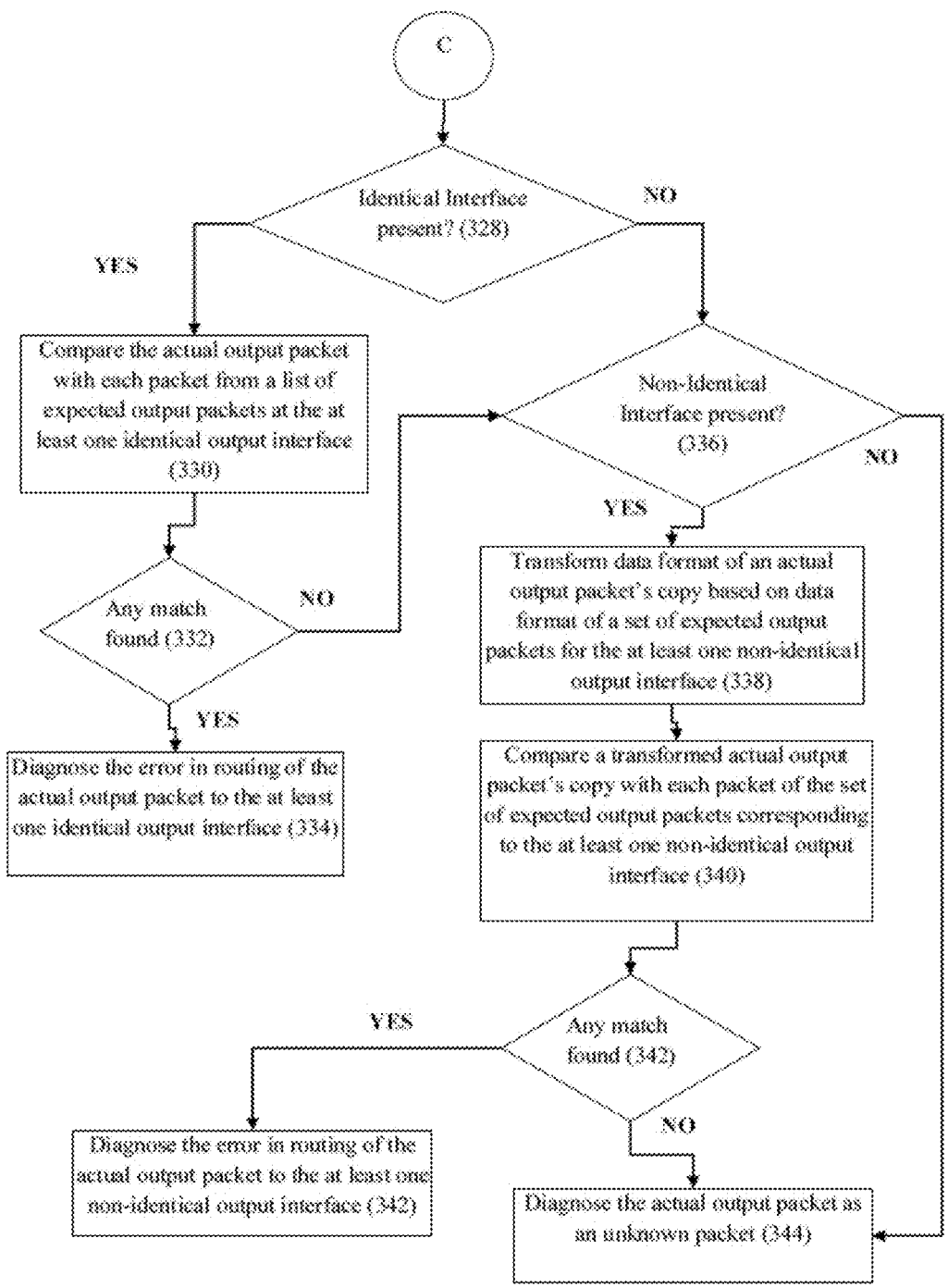

In another embodiment, at block 328 of the FIG. 3*c*, the prediction unit 202 may identify at least one identical output interface, from a set of output interfaces, corresponding to a current output interface. The prediction unit 202 identifies the at least one identical output interface when the actual output packet is not matched with at least one of the set of preceding expected output packets corresponding to the expected output packet. The at least one identical output interface is identified from a set of at least one output interface pertaining to the current output interface. In one example, the at least one identical output interface may be identified by choosing at least one of an interface protocol, ports, and connections from a set of at least one of an interface protocol, ports, and connections pertaining to the current output interface. Once the at least one identical output interface is identified, at block 330 of the FIG. 3*c*, the comparison unit 204 compares the actual output packet with each packet from the list of expected output packets for the at least one identical output interface. If the match is found at block 332 of the FIG. 3*c*, at block 334, the diagnosing unit 206 may diagnose the error in routing of the actual output packet to the at least one identical output interface.

In yet another embodiment, when the at least one identical output interface is not identified, at block 336 of the FIG. 3*c*, the prediction unit 202 may identify at least one non-identical output interface. In one aspect, the prediction unit 202 may identify at least one non-identical output interface choosing at least one of the interface protocol, ports, and connections from the set of interface protocol, ports, and connections not pertaining to the current output interface. It is to be noted that data format corresponding to a set of expected output packets at the non-identical output interface is different than the data format of the actual output packet. Thus, subsequent to identifying the at least one non-identical output interface, at block 338 of the FIG. 3*c*, the prediction unit 202 may generate an actual output packet's copy corresponding to the actual output packet. Upon generation, the prediction unit 202 may transform data format of the actual output packet's copy based on the data format of the set of expected output packets corresponding to the at least one non-identical output interface.

Once the actual output packet's copy is transformed, at block 340 of the FIG. 3*c*, the comparison unit 204 may compare the transformed actual output packet's copy with each packet from the set of expected output packets corresponding to the at least one non-identical output interface. If the match is found, at block 342 of the FIG. 3*c*, the diagnosing unit 206 may diagnose that the actual output packet is routed to the at least one non-identical output interface erroneously. In one embodiment, at block 344 of the FIG. 3*c*, when the transformed actual output packet's copy is not matched with at least one packet of the set of expected output packets, the diagnosing unit 206 may diagnose the actual output packet as an unknown packet. In another aspect, at block 336 of the FIG. 3*c*, when the at least one non-identical output interface is not identified, the actual output packet is diagnosed as an unknown packet.

In order to elucidate further, consider an example where 5 packets (indexed as 1, 2, 3, 4, and 5) are injected into the DUV/SUV and are expected to be received in order at the output interface of the DUV/SUV. Packets 1 and 2 are successfully received at the output. Subsequently, an actual output packet 4 is received instead of an actual output packet 3. The comparison unit 204 may compare the actual output packet 4 with the expected output packet 3. As the match is not found, the diagnosing unit 206 may diagnose the error as an ordering error or a packet drop error. In one embodiment, if the match is not found, the comparison unit may compare the subsequent expected output packet 4 with the actual output packet 4. When the match is found, the expected output packet may be updated to packet 5. If the actual output packet is also packet 5, the comparison unit 204 may compare the actual output packet 5 with the expected output packet 5 and the match is found. In this case, if the next actual output packet is received as 3, the comparison unit 204 may compare the preceding packets of the set of expected output packets with the actual output packet 3. If the match between the actual output packet 3 and the preceding expected output packet 3 is found, the diagnosing unit 206 may diagnose the error as an ordering error associated with actual output packet 3. In another embodiment, when an expected output packet is not matched with any of the actual output packets from the set of actual output packets, the diagnosing unit may diagnose the packet drop error associated with the corresponding expected output packet.

In another example, when the functionality of the DUV/SUV is broken, the set of input packets may not be processed normally. In the event of a functionality failure, the actual output packet may not match with the corresponding expected output packet. Thus in order to diagnose the error the match score is computed. For example, consider an actual output packet having a data field from the set of data fields as a "channel id". The value of "channel id" field for the corresponding expected output packet is 5. It is to be noted that in the event of mismatch in the set of fields, the system diagnoses the error by an error reference code associated with the data field. It is important to note that the user may store the error values associated with the error reference code in the database. In this example, consider the error value for the "channel id" field as '0' and '100'. The error reference code associated to the "channel id" value '0' is "Reserved Channel ID Usage". Similarly, the error reference code associated to the "channel id" value '100' is "Channel ID Outside Configured Range". Thus during implementation, when the "channel id" field with values '0' or '100' are identified, the system would report diagnostic information as the "Reserved Channel ID Usage" or the "Channel ID Outside Configured Range" respectively.

Similarly, if for an expected output packet, value for another data field "Destination Node" is '1' in the event of a node replacement. The user configurable mismatch value for the "Destination Node" field may be '0' when the node replacement is missed. Thus, when the value of the "Destination Node" field of the actual output packet is '0', the system would diagnose the error in the "Destination Node" field of the actual output packet with the associated error reference code as "Destination Node Replacement Never Happened".

In another example, if for an expected output packet, the value for another data field "CRC" is '12_34' after a packet is updated. The user configurable mismatch value for the "CRC" field may be '10_10' due to a missed "CRC" field recalculation after a packet is updated. Thus, when the value of the "CRC" field of the actual output packet is '10 10', the system would diagnose the error in the "CRC" field of the actual output packet with the associated error reference code as "Missed CRC Re-Calculation".

In yet another example, consider 5 packets (indexed as 1, 2, 3, 4, and 5) are injected into the DUV/SUV. It is to be noted that the DUV/SUV has one or more output interfaces comprising identical output interfaces and non-identical output interfaces. The identical output interface may include X1 and X2 and the non-identical output interface may include Y. Out of the 5 packets, packet 1 and packet 2 are expected to be received at an identical output interface X1 and packet 3 and packet 4 is expected to be received at an identical output interface X2. The packet 5 is expected to be received at the non-identical output interface Y. In the event of a failure, if packet 2 is routed to the identical output interface X2, then a data mismatch would be observed at a data integrity checker of the identical output interface X2. In order to diagnose the error associated with the packet 2, the system compares the packet 2 with the subsequent expected output packets at the identical output interface X1. If the packet 2 matches with at least one of the subsequent expected output packets, the system diagnoses the error as an error in routing of the packet 2 to the identical output interface X2.

Similarly, if the packet 4 is sent to the non-identical output interface Y, there will be a data mismatch at the data integrity checker of the non-identical output interface Y when the packet 4 does not match with the packet 5. It is to be noted that the packet 4 was destined to the identical output interface X2, thus in order to diagnose the error, the system may identify at least one non-identical output interface X1 and X2 where the packet 4 was supposed to be sent. In order to do so, initially, the system generates a packet 4's copy corresponding to the packet 4. Further, the system may transform the data format of the packet 4's copy as per the data format of the at least one non-identical output interface X1 and X2. Further, the packet 4's copy is compared with the subsequent expected output packets at the non-identical output interfaces X1 and X2 till the match is found. If the match is found, the system would diagnose the error as an error in routing of the packet 4 to the non-identical output interface Y.

Figure 4:
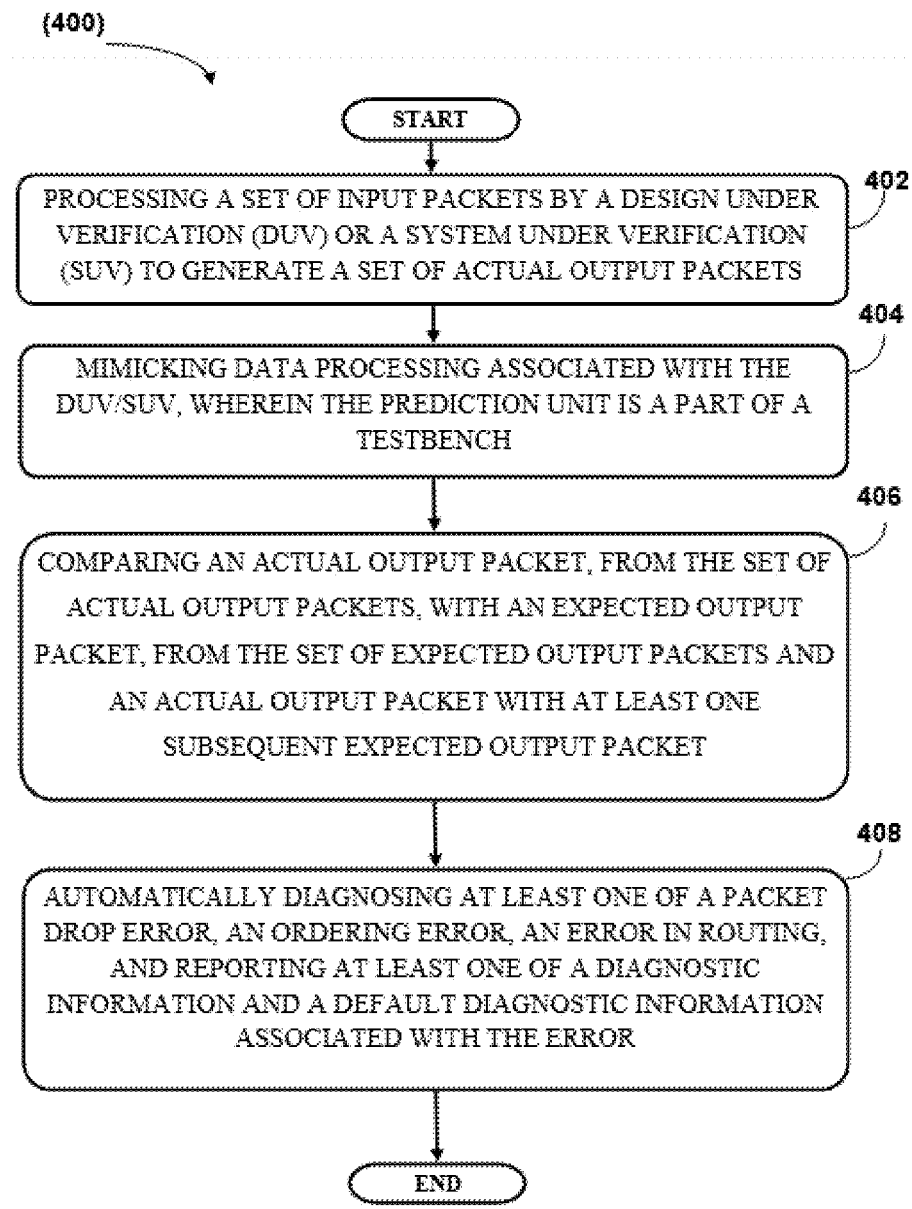
FIG. 4 illustrates a method for automatically diagnosing an error by performing a systematic failure analysis of a functional simulation pertaining to the DUV/SUV, in accordance with an embodiment of the present subject matter.

Referring now to FIG. 4, a method 400 for automatically diagnosing an error by performing a systematic failure analysis of a functional simulation pertaining to the DUV/SUV is shown, in accordance with an embodiment of the present subject matter. The method 400 may be described in the general context of computer executable instructions. Generally, computer executable instructions can include routines, programs, objects, components, data structures, procedures, modules, functions, etc., that perform particular functions or implement particular abstract data types. The method 400 may also be practiced in a distributed computing environment where functions are performed by remote processing devices that are linked through a communications network. In a distributed computing environment, computer executable instructions may be located in both local and remote computer storage media, including memory storage devices.

The order in which the method 400 is described is not intended to be construed as a limitation, and any number of the described method blocks can be combined in any order to implement the method 400 or alternate methods. Additionally, individual blocks may be deleted from the method 400 without departing from the spirit and scope of the subject matter described herein. Furthermore, the method can be implemented in any suitable hardware, software, firmware, or combination thereof. However, for ease of explanation, in the embodiments described below, the method 400 may be considered to be implemented as described in the system 102.

At block 402, a set of input packets may be processed by a Design Under Verification (DUV) or a System Under Verification (SUV) to generate a set of actual output packets. In one implementation, each input packet from the set of input packets comprises a set of data fields.

At block 404, data processing associated with the DUV/SUV may be mimicked by a prediction unit 202. In one implementation, the prediction unit 202 is a part of a testbench. In another implementation, the prediction unit 202 is configured to process a set of input packets' copy for generating a set of expected output packets.

At block 406, an actual output packet may be compared with an expected output packet. In one implementation, the comparison is facilitated by a comparison unit 204. The comparison unit 204 is configured to compare an actual output packet, from the set of actual output packets, with an expected output packet, from the set of expected output packets, corresponding to the actual output packet. In another implementation, when the actual output packet is not matched with the expected output packet, the actual output packet may be compared with at least one subsequent expected output packet corresponding to the expected output packet.

At block 408, at least one of a packet drop error, an ordering error, an error in routing may be automatically diagnosed by a systematic failure analysis and at least one of a diagnostic information and a default diagnostic information associated with the error may be reported. In one implementation, the diagnosis may be facilitated by the diagnosing unit 206.

Exemplary embodiments discussed above may provide certain advantages. Though not required to practice aspects of the disclosure, these advantages may include those provided by the following features.

Some embodiments enable a system and a method to reduce test/simulation failures analysis and debug time significantly.

Some embodiments enable a system and a method to improve debug efficiency associated with a simulation environment.

Some embodiments enable a system and a method to facilitate faster verification of complex Device Under Verification (DUV) or System Under Verification (SUV).

Some embodiments enable a system and a method to be implemented in an Object Oriented Programming (OOP) based Verification Environment including, but not limited to, System Verilog, OVM, VMM, and UVM.

Although implementations for methods and systems for automatically diagnosing an error by performing a systematic failure analysis of a functional simulation have been described in language specific to structural features and/or methods, it is to be understood that the appended claims are not necessarily limited to the specific features or methods described. Rather, the specific features and methods are disclosed as examples of implementations for automatically diagnosing an error and reporting diagnostic information by performing a systematic failure analysis of a functional simulation.

The invention claimed is:

1. A system for automatically diagnosing an error by performing a systematic failure analysis of a functional simulation, the system comprising:
  a Design Under Verification (DUV) or System Under Verification (SUV), wherein the DUV/SUV is configured to process a set of input packets to generate a set of actual output packets, wherein each input packet from the set of input packets comprises a set of data fields;
  a testbench configured to communicate with the DUV/SUV, wherein the testbench includes:
    a prediction unit corresponding to the DUV/SUV, wherein the prediction unit is configured to mimic the data processing associated with the DUV/SUV, and wherein the prediction unit is configured to process a set of input packets' copy for generating a set of expected output packets;
    a comparison unit configured to compare
      an actual output packet, from the set of actual output packets, with an expected output packet, from the set of expected output packets, corresponding to the actual output packet, and
      the actual output packet with at least one subsequent expected output packet corresponding to the expected output packet, when the actual output packet is not matched with the expected output packet, wherein the actual output packet is compared with the at least one subsequent expected output packet until the match is found;
    a diagnosing unit configured to
    automatically diagnose at least one of a packet drop error, an ordering error, an error in routing, and report at least one of a diagnostic information and a default diagnostic information associated with the error;
    compare a set of data fields in the actual output packet with a respective plurality of data fields in the corresponding expected output packet when the actual output packet is not matched with the at least one subsequent expected output packet;
    compute a match score based upon the comparison of the set of data fields with the plurality of data fields;
    compare a value of each non-matching data field, of the set of data fields, with an error value associated to an error reference code for the plurality of data fields when the match score is greater than a predefined score;
    report the diagnostic information associated with the error reference code when the value and the error value are matched, and
    the default diagnostic information associated with the error reference code when the value and the error value are not matched.

2. The system of claim 1 is further configured to
  compare the actual output packet with a set of preceding expected output packets corresponding to the expected output packet when the match score is less than the predefined score; and
  diagnose the ordering error associated with the actual output packet when the actual output packet is matched with at least one of the set of preceding expected output packets.

3. The system of claim 2 is further configured to
  identify at least one identical output interface, from a set of output interfaces, corresponding to a current output interface, wherein the at least one identical output interface is identified when the actual output packet is not matched with at least one of the set of preceding expected output packets;
  compare the actual output packet with each packet from a list of expected output packets at the identified at least one identical output interface; and
  diagnose the error in routing of the actual output packet to the at least one identical output interface when the actual output packet matches with at least one packet from the list of expected output packets for the corresponding identical output interface.

4. The system of claim 3 is further configured to
  identify at least one non-identical output interface from the set of output interfaces not corresponding to the current output interface, wherein the at least one non-identical output interface is identified when the at least one identical output interface is not identified;
  transform the data format of an actual output packet's copy based on a data format of a set of expected output packets for the identified at least one non-identical output interface;
  compare a transformed actual output packet's copy with each packet of the set of expected output packets corresponding to the identified at least one non-identical output interface; and
  diagnose the error in routing of the actual output packet to the at least one non-identical output interface, when the transformed actual output packet's copy matches with at least one expected output packet of the identified at least one non-identical output interface.

5. The system of claim 4, wherein the at least one non-identical output interface is identified when the actual output packet is not matched with at least one packet from the list of expected output packets.

6. The system of claim 4 is further configured to diagnose the actual output packet as an unknown packet when at least one of the non-identical output interface is not identified.

7. The system of claim 4 is further configured to diagnose the actual output packet as the unknown packet when the transformed actual output packet's copy is not matched with the at least one expected output packets for the at least one non-identical output interface.

8. A method for automatically diagnosing an error by performing a systematic failure analysis of a functional simulation, the method comprising steps of:

processing a set of input packets by a Design Under Verification (DUV) or a System Under Verification (SUV) to generate a set of actual output packets, wherein each input packet from the set of input packets comprises a set of data fields;

mimicking, by a prediction unit corresponding to the DUV/SUV, data processing associated with the DUV/SUV, wherein the prediction unit is a part of a test-bench, and wherein the prediction unit is configured to process a set of input packets' copy for generating a set of expected output packets;

comparing, by a comparison unit,
- an actual output packet, from the set of actual output packets, with an expected output packet, from the set of expected output packets, corresponding to the actual output packet,
- an actual output packet with at least one subsequent expected output packet corresponding to the expected output packet, when the actual output packet is not matched with the expected output packet, wherein the actual output packet is compared with the at least one subsequent expected output packet until the match is found;

diagnosing, automatically by a diagnosing unit, at least one of a packet drop error, an ordering error, an error in routing, and reporting at least one of a diagnostic information, and a default diagnostic information associated with the error;
- comparing a set of data fields in the actual output packet with a respective plurality of data fields in the corresponding expected output packet when the actual output packet is not matching with the at least one subsequent expected output packet;
- computing a match score based upon the comparison of the set of data fields with the plurality of data fields;
- comparing a value of each non-matching data field, of the set of data fields, with an error value associated to an error reference code for the plurality of data fields when the match score is greater than a predefined score;
- reporting
  - the diagnostic information associated with the error reference code when the value and the error value are matched, and
  - the default diagnostic information associated with the error reference code when the value and the error value are not matched.

9. The method of claim 8 further comprises
comparing the actual output packet with a set of preceding expected output packets corresponding to the expected output packet when the match score is less than the predefined score; and diagnosing the ordering error associated with the actual output packet when the actual output packet matches with at least one of the set of preceding expected output packets.

10. The method of claim 9 further comprises
identifying at least one identical output interface, from a set of output interfaces, corresponding to a current output interface, wherein the at least one identical output interface is identified when the actual output packet is not matched with at least one of the set of preceding expected output packets;

comparing the actual output packet with each packet from a list of expected output packets at the at least one identical output interface; and diagnosing the error in routing of the actual output packet to the at least one identical output interface when the actual output packet is matched with at least one packet from the list of expected output packets.

11. The method of claim 10 further comprises
identifying at least one non-identical output interface from the set of output interfaces not corresponding to the current output interface, wherein the at least one non-identical output interface is identified when the at least one identical output interface is not identified;

transforming a data format of an actual output packet's copy based on a data format of a set of expected output packets for the identified at least one non-identical output interface;

comparing a transformed actual output packet's copy with each packet of the set of expected output packets corresponding to the identified at least one non-identical output interface; and diagnosing the error in routing of the actual output packet to the at least one non-identical output interface, when the transformed actual output packet's copy is matching with at least one expected output packet of the identified at least one non-identical output interface.

12. The method of claim 11, wherein the at least one non-identical output interface is identified when the actual output packet is not matched with at least one packet from the list of expected output packets.

13. The method of claim 11, wherein the actual output packet is diagnosed as an unknown packet when at least one of the non-identical output interface is not identified.

14. The method of claim 11, wherein the actual output packet is diagnosed as an unknown packet when the transformed actual output packet's copy is not matching with the at least one expected output packets of the at least one non-identical output interface.

* * * * *